United States Patent [19]

DeLapp et al.

[11] Patent Number: 4,686,467
[45] Date of Patent: Aug. 11, 1987

[54] CIRCUIT BOARD TESTING SYSTEM

[75] Inventors: Dennis W. DeLapp, Jackson County, Mo.; Richard K. Roebuck, Johnson County, Kans.

[73] Assignee: DIT-MCO International Corp., Kansas City, Mo.

[21] Appl. No.: 591,914

[22] Filed: Mar. 21, 1984

[51] Int. Cl.[4] .......................................... G01R 31/02
[52] U.S. Cl. ........................... 324/158 F; 324/73 PC; 324/158 P
[58] Field of Search ............... 324/72.5, 158 F, 158 P, 324/73 PC; 339/17 CF, 17 M, 18 R, 18 C, 108 TP, 149 P, 150 B, 151 B, 154 R, 154 A, 156 R, 157 R

[56] References Cited

U.S. PATENT DOCUMENTS 4,535,536  8/1985  Wyss ............................. 324/158 F

FOREIGN PATENT DOCUMENTS 2933862  5/1981  Fed. Rep. of Germany ... 324/73 PC
2086670  5/1982  United Kingdom ............ 324/158 F

OTHER PUBLICATIONS

Mania Brochure; Mania . . . GmbH, Hauptstrasse 86, Schmitten 2, W. Germany; no date; pp. 1-7.
Tech. Bull. TB 7005-1; "Formed Pin Transition Board"; 1976; Ditmco International, Kansas City, Mo.
"Universelles Leiterplatten-Prufsystem", pp. 1-8; pub. of ATG Electronic Automatische Test-Gerate GmbH; Wertheim-Reicholzheim, West Germany.

*Primary Examiner*—Ernest F. Karlsen
*Attorney, Agent, or Firm*—Kokjer, Kircher, Bradley, Wharton, Bowman & Johnson

[57] ABSTRACT

A transition device is provided for coupling contact points on a printed circuit board to points in a standard test fixture matrix wherein the pattern of the two sets of points probably do not match. A product pattern plate has holes in the pattern of a printed circuit board to be tested and a grid plate has the pattern of the standard test fixture matrix. Pins are passed through the holes in the product pattern plate and find a hole in the grid plate in accord with the relative size of the pins and the holes in the product pattern plate.

3 Claims, 3 Drawing Figures

CIRCUIT BOARD TESTING SYSTEM

This invention relates to a transition means for electrically connecting the contact points of a printed circuit board with the uniform grid of contact probes on a basic fixture matrix for testing the board circuitry.

The use of intermediate transition elements in circuit board testing has been known for some time. One of the earliest arrangements is disclosed in U.S. Pat. No. 3,654,585. A flexible plate is provided on one side with a grid of contacts arranged in a uniform array to match the contact probes of a standard test fixture matrix. The other side of the plate is provided with contacts arranged in the same pattern as the pattern of the contact points for the circuit board. Each contact point on the product side of the plate is electrically connected through the plate with a grid contact. The grid contacts are, of course, connected with the test equipment and by energizing the appropriate grid contacts the board can be tested.

Another form of transition element is described in Technical Bulletin TB 7005-1, dated October, 1976, by DitMco International titled "Formed Pin Transition Board". In this case the transition element is in the form of two separate guide plates connected together in spaced relationship. There is a lower plate and an upper plate. Rigid pins extend through holes provided in both the upper and lower plates. One end of the rigid pin probes a printed circuit board and the other engages the test fixture contacts in the grid. The upper plate is drilled to the pattern of the contact points on the circuit board to be tested, whereas the lower board is provided with a uniform array of holes matching the grid contact points for the test fixture. Wherever the board contact points are offset with respect to an axis of a hole in the lower guide plate, the pin is bent at mid-length so as to accommodate the offset.

The foregoing transition elements, while satisfactory in their time, still present disadvantages. In the case of the single transition plate each plate was usable for only one circuit board design. In the case of the formed pin unit, the same thing was true, as the pins were made a permanent part of the transition unit and once formed, were not reusable.

Recently there has been a further development by Mania GmbH of Schmitten, West Germany, which has some of the characteristics of the formed pin board unit, but which uses special pins. There are two upper guide plates which are drilled with holes to match the pattern of the circuit board contacts. In assembling the Mania unit the two upper guide plates are aligned and the pins inserted through th matching holes in the guide plates. A third plate with holes arranged in uniform grid is then added. The special pins have flexible tips which seek out and pass through the grid holes. The pins can be removed by turning the plates upside down; they will drop out and can be used again with a different set of product patterned guide plates.

SUMMARY OF THE INVENTION

The present invention differs from the prior art, more particularly the Mania unit, in that it provides a transition unit in which simple rigid, straight probe pins can be employed. Only two plates are necessary, one being a product pattern guide plate and the other a uniform grid plate, and thus only one plate need be drilled to the product pattern. The plates are connected with one another in spaced relationship. The pins are dropped into position by registering their leading ends with the holes or openings in the upper plate and pemitting them to drop through the holes toward the lower plate. While those pins that do not immediately pass through openings in the lower plate will come to rest on the upper surface of the lower plate, a simple vibration or shaking of the unit in a lateral direction will displace the pins so that their ends will find grid holes to drop through.

The degree of possible lateral movement of the pins once dropped through the openings in the product pattern plate, is controlled by establishing predetermined dimensional relationships between the diameter of the pin shaft, diameter of the pin holes and thickness of the product plate, which determines the lengthwise dimension of the pin hole. Because of the irregularity between the product pattern relative to the grid pattern that most likely will exist in many, if not all, instances, the product pattern holes in the product guide plate will not be axial aligned with the gride holes in the grid plate. Thus provision is made for limited axially inclination of the pins sufficient to assure that the leading end of any given pin will be able to find a grid hole to drop through. The leading end of the pin is, however, confined to predetermined limits of lateral departure or offset from the axis of the pin opening, but is provided enough freedom of movement to insure that it will find and drop through a grid hole and thus be properly positioned for an electrical contact with a spring probe in the electrical test matarix.

No special design characteristics must be met for the pins other than they be stiff enough in a column sense to withstand test pressures without collapse. They need not be flexible nor do they require the inclusion of any spring mechanisms or the like.

The pins are reusable for testing other products. All that is required to recapture the pins is to invert the pin holding plates and the pins will drop freely out so they can be collected and used again in association with a test unit having a different product plate.

Other and further objects and features of the invention together with the features of novelty which are appurtenant thereto will appear in the course of the following description.

DETAILED DESCRIPTION OF THE INVENTION

In the accompanying drawing, which forms a part of the specification and is to be read in conjunction therewith, and in which like reference numerals indicate like parts in the various views.

Figure 1:
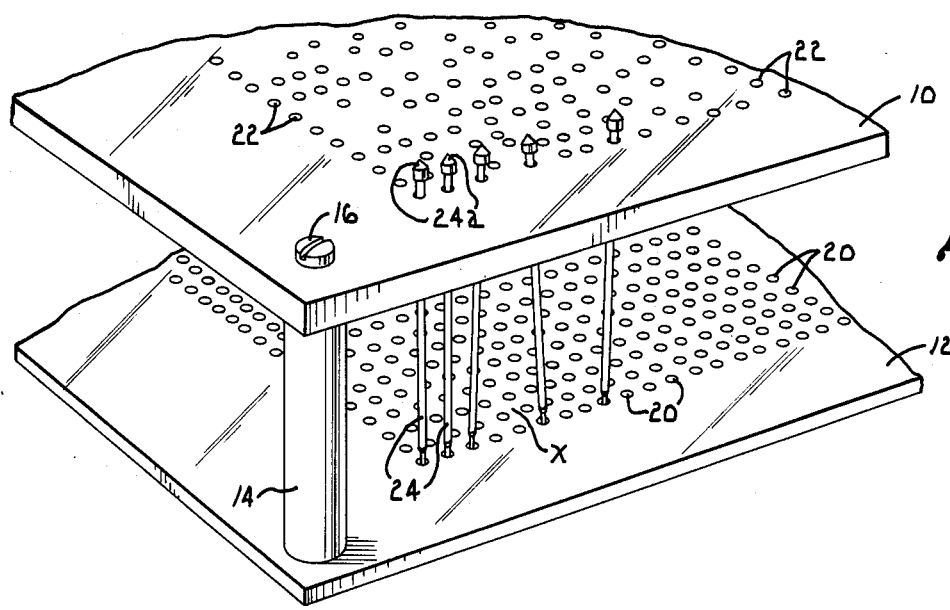
FIG. 1 is a fragmentary perspective view showing a corner portion of a transition assembly including the upper product plate, lower grid plate and a plurality of representative probe pins.
Figure 2:
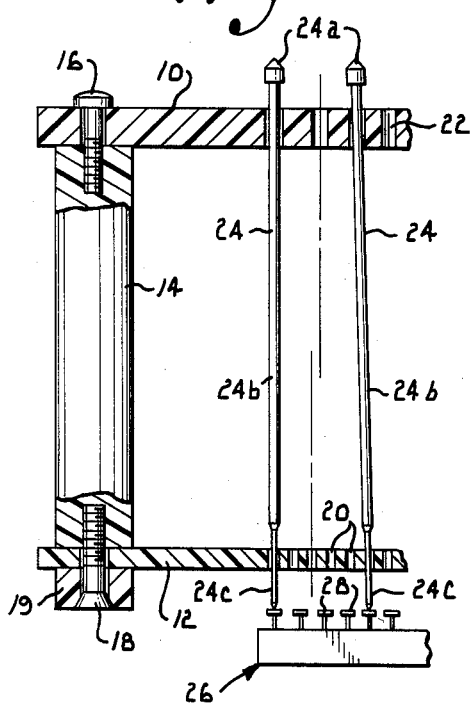
FIG. 2 is a fragmentary sectional view of same.

Referring now to the drawing, the transition unit of the present invention in its preferred form comprises an upper plate 10 and a lower parallel plate 12 which are separated by cylindrical spacers 14 at the corners and at mid-length. The plates are held together with one another and the by screws 16 and 18 which extend through appropriate openings in the plates and into the spacers. The spacers are in the form of cylinders with threaded bores in each end. The screws 16 threadedly engage within the end bores. Cylindrical feet 19 are positioned by the same screws 18 that fasten the lower plate.

The plates are formed from a suitable dielectric material such as, for example, a polycarbonate (Lexan) or the like.

The bottom plate 10 is provided with a uniform rectangular grid-like matrix of holes 20. Preferably the spacing of the holes is 0.100 inches center to center with the holes arranged in columns and transverse rows. The holes can be formed by drilling through the plate. Preferably they are circular and of uniform diameter through the thickness of the plate.

The upper plate is also provided with a pattern of holes 22. In this case, however, the hole pattern is a duplicate of the location of the electrical contact points on the circuit board to be tested (not shown). This is accomplished most easily by correlating an artwork representation of the circuit board pattern with the face of the upper plate and drilling holes in the plate corresponding to the contact locations.

The holes in the upper plate are likewise circular and of uniform diameter throughout the thickness of the top plate.

The electrical transition through the assembly is provided by individual straight substantially rigid probe pins 24. The pins 24 are made of material having good properties of electrical conductivity, for example, nickel plated one-half hard brass or nickel silver. Each pin is primarily cylindrical and provided with an enlarged head portion 24a which provides a conical head surface and also establishes a shoulder or abutment that is of greater diameter measured in a direction transverse to the axis of the pin than the diameter of the holes in the top plate. The pins are thus prevented from dropping through the plate openings in the event there is no support from below, as when the unit is being handled prior and subsequent to the test procedure.

Preferably the pins are stepped in diameter, the greater diameter portion indicated at 24b and the smaller diameter tip portion at 24c.

As will be evident, the pins are of sufficient length that when installed in the plate assembly the bottom end of each pin will extend well below the underside of the lower plate 12 with the head portion of the pin above the upper plate.

The pins are loaded into the plate assembly by positioning them substantially vertically above the upper plate with the lower ends adjacent the upper face and moving the leading ends into registry with the holes in the upper plate. This can be most easily done by loosely grasping a bundle of pins and sliding the leading ends over the hole pattern, letting the individual pins drop in as they register with the holes. If loosely held the pins will drop by gravity through the top plate holes and as the leading ends reach the upper surface of the bottom plate, will either register immediately with a grid hole and pass on downwardly therethrough or be intercepted by a solid area between holes. Shaking or vibratating the assembly in a lateral direction will cause sufficient lateral movement of the lower or leading ends of the intercepted pins as to cause them to find and fall through an open grid hole near the point of interception. The leading ends of the pins are tapered in the form of a conical tip to assist in the locating of the pins in the holes of the bottom plate as well as the top plate.

The provision for the lateral movement described above is an important feature of the invention. This is achieved by so correlating the diameter of the holes 20, the outside diameter of the pin portion received therethrough and the thickness of the top plate that each pin is received in a hole 20 in a sufficiently loose fit as to permit the necessary inclination of the pin to accommodate the lateral movement of the bottom or leading end of the pin. On the other hand, to prevent excessive inclination of the pins from the vertical which could result in loss of registry of the upper pin ends with the circuit board contacts and failure of the leading end to find a grid hole, the permissible movement must be limited to a maximum.

The maximum distance that the pin leading end can be away from a hole in any set of four holes in the bottom plate would be at the center of the set, as illustrated by point X in FIG. 1. Point X, being at the center of a square, is equidistant from the center lines of the holes forming the four corners and thus is located at the midpoint of the hypotenuse of a right triangle having two equal sides whose lengths are equal to center to center dimension of the uniform matrix holes. In the case of the illustrative matrix of holes space 0.100 inches center to center, the maximum departure of the leading or bottom end of the pin from the center line of the plate hole 20 in which the pin is received is one half of 0.141 inches (the diagonal distance between corner holes, or hypotenuse) or approximately 0.070 inches.

By providing the described freedom of lateral movement of the lower pin end it is assured that each such pin end will be in position to find a hole even if the contact point is offset at the maximum possible distance from a given set of four holes.

A specific example of dimensions for a typical test assembly is set forth below. It will be understood that the surface area of the plates may vary without affecting these dimensions.

Top plate thickness: 0.250 inches.
Bottom plate thickness: 0.125 inches.
Pin diameter (at top plate hole): 0.062 inches.
Top plate hole diameter: 0.069 inches.
Bottom plate matrix pitch: 0.100 inch.
Pin Daimeter (at bottom plaate hole): 0.050 inches.
Bottom plate hole diameter: 0.055 inch.
Plate spacing (top face of top plate to bottom.
face of bottom plate: 2.950 inches.
Pin length: 3.250 inches.

Figure 3:
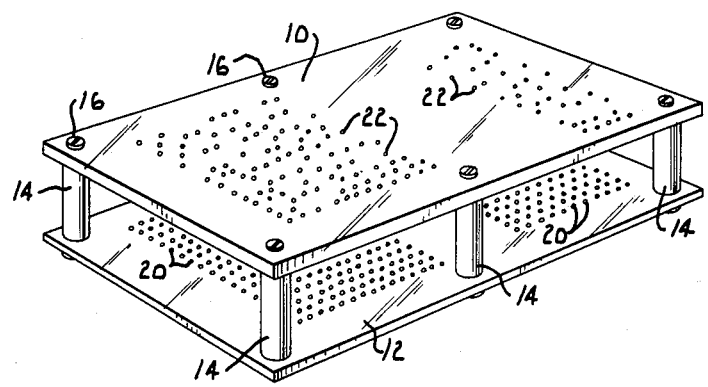
FIG. 3 is a perspective view illustrating a complete typical transition unit without pins.

In using the system for test purposes all of the upper plate holes are filled with the probe pins and all probe pins extended on through a matrix hole in the bottom plate. The filled unit is then associated in the known way with the test analyzer (illustrated schematically in FIG. 3 at 26) which includes the spring probes 28. The probes are arranged in the same uniform matrix pattern as the matrix of holes on the bottom plate. The board to be tested is lined up so that the electrical contact points register with the pin heads above the top plate and the board is pressed against pin heads to establish electrical contact between the contact points and pins. The enlarged heads are sufficient to compensate for the slight offset of the heads from the hole center lines for those pins which are inclined as described earlier.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, I claim:

1. A system for testing printed circuit boards, said system comprising:

a pair of parallel horizontal plates secured in fixed relationship with one another, one said plate being a product pattern plate and the other a grid plate, said grid plate being located below said product pattern plate and provided with a grid matrix of holes therethrough with the holes uniformly spaced in columns and transverse rows, said pattern plate being provided with a plurality of holes conforming with the electrical contact points on the board to be tested, the centerlines of at least some of the holes in the product pattern plate being laterally offset with respect to the centerline of the hole in the grid plate nearest to the centerline of each of said some holes, a plurality of electrically conductive substantially rigid straight pins insertable through said holes in said pattern plate, said pins each having a head at one end above said pattern plate and a tip at the other end for passage through a hole in said grid plate, the outside dimension of said pins and the inside dimension of said holes in said product pattern plate being so related as to permit inclination of the pins in said some holes relative to the center line of said holes in which they are received sufficient to displace the tips of said pins in said some holes laterally into registry with the said nearest holes thereto in the grid plate, the distance from center to center of opposed corner holes in a set of four holes in the grid plate being defined as Y, the permissible maximum lateral movement of said tips of the pins in said some holes when adjacent the upper surface of said grid plate being limited to substantially one half Y, said pins being freely removable from said holes by movement in the direction opposite from the direction of insertion of the pins.

2. A system as in claim 1, said heads of said pins having a shoulder of greater dimension than the product pattern plate holes in which they are received whereby to prevent the heads from passing through the holes.

3. A system as in claim 2, each said head being of conical shape with the tip of the cone forming the end of the pin.

* * * * *